United States Patent [19]

Yasui et al.

[11] 4,204,722
[45] May 27, 1980

[54] MEANS FOR LOCKING A CIRCUIT BOARD TO A CONNECTOR

[75] Inventors: Hiroshi Yasui, Musashi Murayama; Yoshiaki Ichimura, Akishima, both of Japan

[73] Assignee: Japan Aviation Electronics Industry, Ltd., Tokyo, Japan

[21] Appl. No.: 956,026

[22] Filed: Oct. 31, 1978

[30] Foreign Application Priority Data

Jun. 20, 1978 [JP] Japan .................................. 53-73704

[51] Int. Cl.² ........................ H01R 13/54; H05K 1/00
[52] U.S. Cl. ............................ 339/17 CF; 339/75 MP
[58] Field of Search ........... 339/17 C, 17 CF, 75 MP, 339/75 M, 176 NP, 174

[56] References Cited

U.S. PATENT DOCUMENTS 3,904,262  9/1975  Cutchaw .................... 339/75 MP X
4,063,791  12/1977  Cutchaw ........................ 339/75 MP Primary Examiner—Roy Lake
Assistant Examiner—Eugene F. Desmond
Attorney, Agent, or Firm—Hammond & Littell, Weissenberger & Muserlian

[57] ABSTRACT

An electrical connector on which a first circuit board is mounted has a series of contact elements therein each with an end portion that projects from the connector, the end portion being soldered to a second circuit board. The connector has a slit parallel to each of the peripheral edges thereof. The slit is separated by bridge portions to form a plurality of openings. The locking means is provided with a protruded edge that engages with the surface of the first circuit board and hook portions each of which can be inserted into a corresponding opening and slid therein for preventing separation of the first circuit board and the connector.

3 Claims, 6 Drawing Figures

MEANS FOR LOCKING A CIRCUIT BOARD TO A CONNECTOR

BACKGROUND OF THE INVENTION

This invention relates generally to disengageable electrical connectors, and in particular to arrangements for maintain such connectors in assembled relationship with circuit boards.

More particularly the present invention relates to means for locking or clamping a printed circuit board such as, for example, a large scale integrated circuit board, to a series of contacts in a connector.

In the electrical connection of a printed circuit board having no protruded conductor therefrom, such as an integrated circuit board or a large scale integrated (LSI) circuit board, to another printed circuit board, it is necessary to use a connector.

Generally the connector of this type consists of a base member made of dielectric material and is provided with a series of contacts along each of the edges or peripheries of the base mamber so as to correspond to a plurality of connecting foil strips arranged along each side of the circuit board. The contact has a resilient head portion at one end thereof and the other end is extended through the base member and protruded therefrom to form a conductor which may be soldered to a connecting apperture or socket of the other circuit board.

In the past, a cover plate having an opening in the central portion of the plate is used, when an integrated circuit board is mounted on a connector. That is, the integrated circuit board is sandwiched in between the cover plate and the base member of the connector so as to contact the foil strips of the circuit board with the corresponding contacts of the connector, and then the cover plate is fixed to the base member by means of threaded pins in order to press fit the foil strips of the circuit board to the contacts of the base member.

Sometimes, however, the cover plate and the circuit boards are subjected to a bending that tends to exert a maximum amount of deflection in a position between the fixed points of the cover plate, and therefore, it is disadvantageous that the retentive forces applied to the strips and the contacts are insufficient to insure positive contact of the connecting strips of the circuit board to the contacts of the base member.

In such an arrangement as mentioned above, the deflection of each of the cover plate and the base member in general increases with an increase in the number of the strips of the circuit board. It is necessary to use a thicker cover plate or to reinforce the cover plate in order to avoid the above described deflection. This, however, increases the cover plate is size, and is undesirable.

With the use of a number of threaded pins, it becomes considerably more complicated to assemble the cover plate, the circuit board and the base member of the connector, and also requires much more space therefor.

Accordingly, an object of the present invention is to provide an arrangement wherein a circuit board such as an integrated circuit board or especially a large scale integrated circuit board is supported by the connector in a manner to resist flexure of the circuit board.

A further object of the present invention is to provide an arrangement in which an integrated circuit board and the base member of a connector are mechanically locked together without using a cover plate.

A still further object of the present invention is to provide an arrangement mentioned above which may easily be assembled and disassembled.

A further object of the present invention is to provide an arrangement in which an integrated circuit board and the base of a connector are mechanically locked without flexing them in accordance with the resilient pressure of the terminals.

These and other objects, advantages and features of the present invention will become more apparent upon a reading of the following description and appended drawings.

THE DRAWINGS

DESCRIPTION OF THE INVENTION

Figure 1:
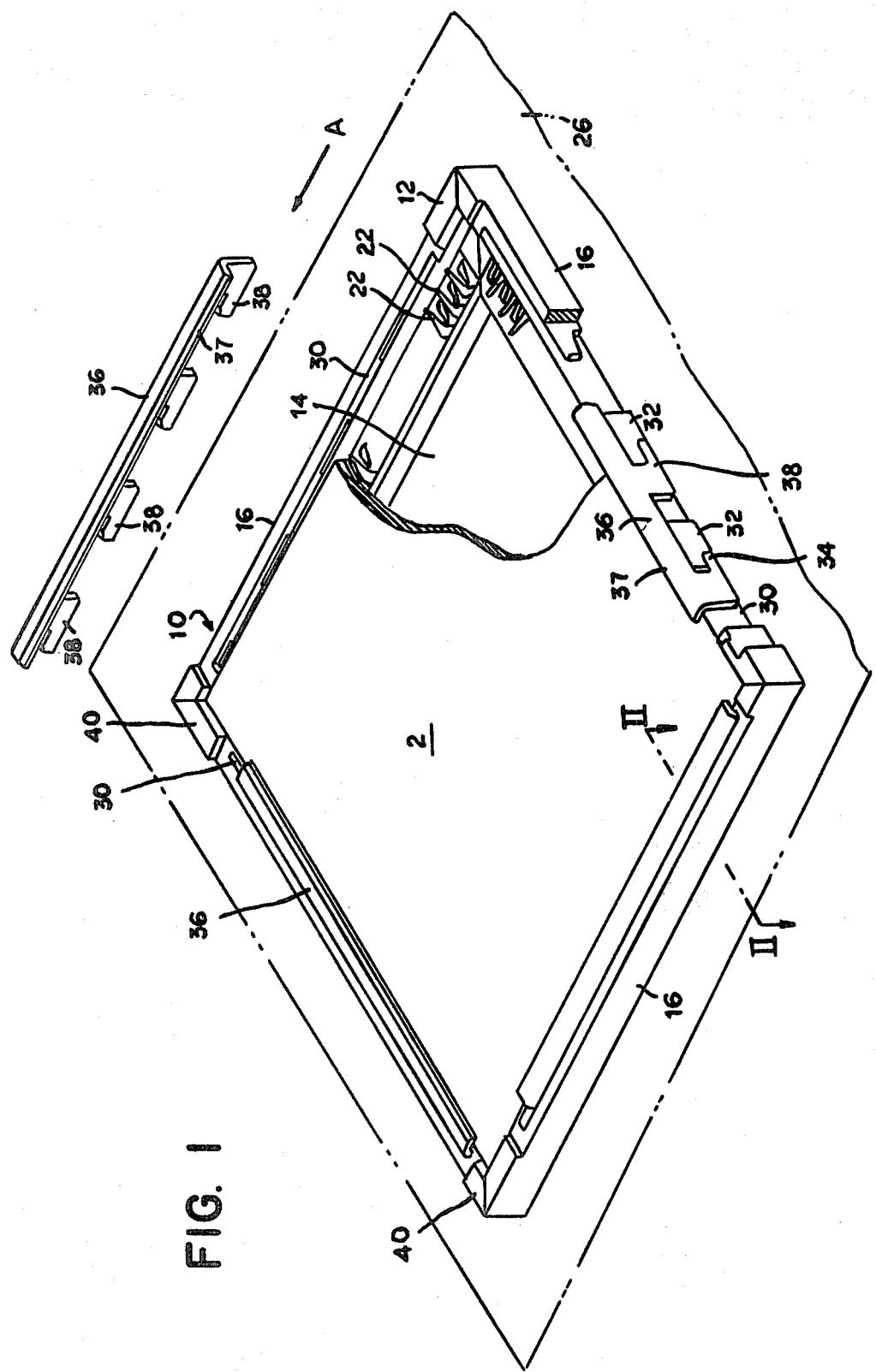
FIG. 1 is a partially cutaway view in perspective of a preferred embodiment of the present invention.
Figure 2:
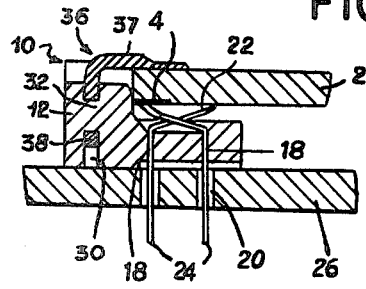
FIG. 2 is a sectional view taken substantially along the lines II—II of FIG. 1.

Referring now in more detail to the drawings (particularly FIG. 1), 2 designates a rectangular or square circuit board, such as an integrated circuit board or a large scale integrated circuit board. A series of connecting foil strips 4 (FIG. 2) are arranged parallel with each of the peripheries of the circuit board 2. A connector element of dielectric material is generally designated as reference numeral 10. The element 10 consists of rectangular or square frame 12 having a rectangular or square opening 14 therein, on which the circuit board 2 may be mounted. The connector has two sets of spaced apart parallel openings 18 in parallel with the periphery of the frame 12 for receiving a series of electrical contact members 20, some of which are shown in the drawing.

The contact member 20 is fabricated of a single piece of sheet metal one end of which is formed to the shape shown as a resilient terminal 22 for contacting with the foil strip 4 of the circuit board 2, and the other end 24 extends through the opening 18 and protrudes beyond the frame 12 of the connector. The end portion 24 of the contact member 20 may be soldered with conductors (not shown) of the circuit on the other circuit board 26.

The connector 10 is provided with a slit or aperture 30 in parallel with the periphery 16 thereof. The slit 30 is spaced apart by bridge portions 32 so as to form a plurality of openings 30a, 30b, 30c and 30d. The bottom of the bridge portion 32 is formed to a notch 34, as shown in the drawing, which cooperates with a lock member 36. As shown in the drawings, the lock member 36 has a protruded edge portion 37 to form an inversed L-shape member.

Figure 3:
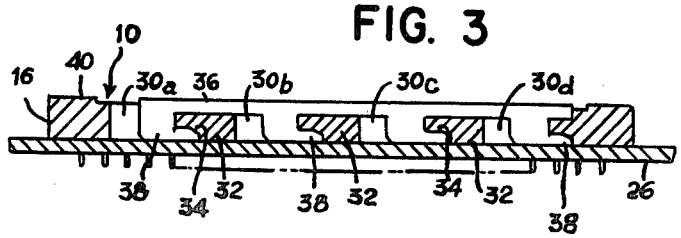
FIGS. 3, 4 and 5 are partial cross sectional views of hook portions of a lock member and a slit of a connector of the present invention.
Figure 5:
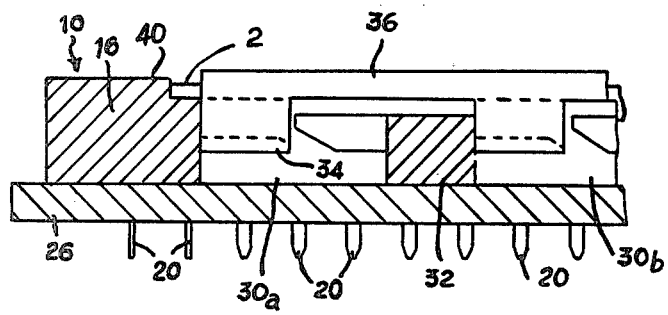
Figure 4:
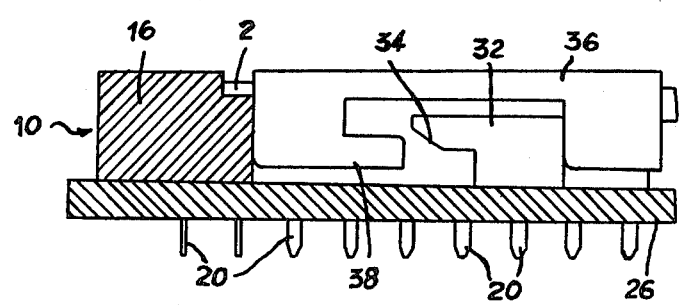

FIGS. 3-5 show the configurations of the bridge portion and the hook portion of the connector according to the present invention. When the lock member 36 is inserted into the slit 30 in the connector 10 and slid in the longitudinal direction thereof, the hook portion 38 of the lock member 36 engages with the bottom of the bridge portion 32, and then the edge portion of the circuit board 2 is press fitted by the protruded edge portion 37 of the lock member 36.

It is preferable to provide a guide shoulder 40 at each corner of the frame member 12 in order to mount the circuit board on the connector correctly.

Figure 6:
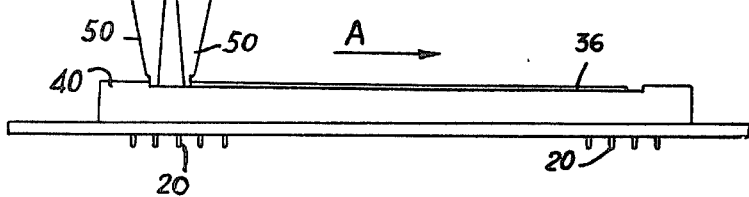
FIG. 6 is a schematic view illustrating a tool for use in engaging or disengaging the lock member of the present invention.

It is possible to use a specific tool 42 for sliding the lock member 36 in the direction of an arrow A in the slit 30 in the connector. As shown in FIG. 6, the tool 42 consists of handles 48 which are pivoted around a pin 44 and provided with a spring 46, and tip portions 50 which are normally kept in contact to each other by means of the spring 46 and may be opened when the handles 48 are seized firmly with the hand. After the tip portions 50 of the tool 42 are inserted in between the guide shoulder 40 of the connector and one end of the lock member 36 mounted in the slit 30 of the connector, when the handles 48 are sized with the hand, the lock member 36 is slid in the direction of the arrow A along the slit 30, and then the hook portions 38 of the connector engage with the notches 34 of the bridge portion to fix the circuit board 2 mounted on the connector.

In order to disassemble the circuit board 2 from the connector 10, the tip portions 50 are inserted into the space between the guide shoulder 40 in the opposite side of the connector and the other end of the lock member 36.

While the invention has been shown and described with reference to a preferred embodiment thereof, it will be understood that changes and variations may be made without departing from the spirit or scope of the following claims.

What we claim is:

1. In combination, an electrical connector for connecting terminal foil strips arranged adjacent to the peripheral edges of an integrated circuit board with conductor elements of another circuit board and a lock member for coupling said connector to said integrated circuit board;

said connector consisting of a rigid dielectric frame member in one piece construction having an opening at a central portion thereof for mounting said integral circuit board therein; and having a plurality of contact elements arranged adjacent to each of the peripheral edges of same frame member so as to correspond to said foil strips of said integrated circuit board, one end of each of said contact elements being formed as a resilient head portion and other end protruding through said frame member to connect with said conductor elements of the other circuit board;

a slit being provided near the outside of each row of said contact elements arranged in each of the peripheral edges of said frame member, said slit being divided by bridge portions into a plurality of openings; and said lock member comprising individual sections each being adapted to be inserted into a slit and having a protruded edge portion adapted to engage a peripheral edge of said integrated circuit board and a plurality of hook portions adapted to engage in said plurality of openings, whereby when said integrated circuit board is placed within said frame member of said connector and when said lock member sections are inserted into said slits and slid along said slits with the underside of said protruded edge portions in contact with the upper surface of said integrated circuit board, each of said hook portions is engaged with the bottom of the corresponding bridge portion so that said connector and said integrated circuit board are clamped between said protruded edge portion and said frame member whereby said frame member and said integrated circuit board are coupled without deflection.

2. A combination according to claim 1 in which said contact elements are made of sheet metal and where the other end of said element is soldered to said conductor element of the other circuit board.

3. A combination according to claim 1 in which said connector has a guide shoulder at each corner thereof.

* * * * *